United States Patent
Lin et al.

(10) Patent No.: US 11,605,431 B2
(45) Date of Patent: Mar. 14, 2023

(54) MEMORY DEVICE AND OPERATION METHOD THEREOF

(71) Applicant: MACRONIX INTERNATIONAL CO., LTD., Hsinchu (TW)

(72) Inventors: Yung-Feng Lin, Taoyuan (TW); Su-Chueh Lo, Hsingchu (TW); Teng-Hao Yeh, Zhubei (TW); Hang-Ting Lue, Hsinchu (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 113 days.

(21) Appl. No.: 17/325,243

(22) Filed: May 20, 2021

(65) Prior Publication Data
US 2022/0375523 A1   Nov. 24, 2022

(51) Int. Cl.
| | |
|---|---|
| G11C 7/00 | (2006.01) |
| G11C 16/08 | (2006.01) |
| G11C 16/24 | (2006.01) |
| G11C 16/30 | (2006.01) |
| G11C 16/26 | (2006.01) |
| G11C 16/14 | (2006.01) |

(52) U.S. Cl.
CPC ............. *G11C 16/08* (2013.01); *G11C 16/14* (2013.01); *G11C 16/24* (2013.01); *G11C 16/26* (2013.01); *G11C 16/30* (2013.01)

(58) Field of Classification Search
CPC ....... G11C 7/1051; G11C 7/1078; G11C 7/22; G11C 7/106; G11C 7/1057

USPC ............................................... 365/63, 189.05
See application file for complete search history.

(56) References Cited

U.S. PATENT DOCUMENTS

| | | | |
|---|---|---|---|
| 6,091,629 A | 7/2000 | Osada et al. | |
| 9,691,478 B1 * | 6/2017 | Lin | ........................ H01L 45/147 |
| 2006/0186947 A1 * | 8/2006 | Lin | ........................ H02M 3/073 |
| | | | 327/536 |
| 2018/0308546 A1 | 10/2018 | Tomita | |
| 2019/0244971 A1 * | 8/2019 | Harari | ............... H01L 23/53257 |

FOREIGN PATENT DOCUMENTS

TW            331637 B        5/1998

* cited by examiner

*Primary Examiner* — Son T Dinh
(74) *Attorney, Agent, or Firm* — McClure, Qualey & Rodack, LLP

(57) ABSTRACT

A memory device and an operation method thereof are provided. The memory device comprises: a memory array; a decoding circuit coupled to the memory array, the decoding circuit including a plurality of first transistors, a plurality of second transistors and a plurality of inverters, the first transistors and the second transistors are paired; and a controller coupled to the decoding circuit, wherein the paired first transistors and the paired second transistors are respectively coupled to a corresponding one inverter among the inverters, and respectively coupled to a corresponding one among a plurality of local bit lines or a corresponding one among a plurality of local source lines; the first transistors are coupled to a global bit line; and the second transistors are coupled to a global source line.

13 Claims, 8 Drawing Sheets

MEMORY DEVICE AND OPERATION METHOD THEREOF

TECHNICAL FIELD

The disclosure relates in general to a memory device and an operation method thereof.

BACKGROUND

In people nowadays lives, electronic devices are everywhere. In electronic devices, memory chips play very important role. Recently, demand for high storage density memory is high. In order to improve storage density, three-dimension (3D) memory is focus to memory manufacturer.

Thus, in order to meet future system requirements, how to improve memory performance is very imperative.

SUMMARY

According to one embodiment, a memory device is provided. The memory device comprises: a memory array; a decoding circuit coupled to the memory array, the decoding circuit including a plurality of first transistors, a plurality of second transistors and a plurality of inverters, the first transistors and the second transistors are paired; and a controller coupled to the decoding circuit, wherein the paired first transistors and the paired second transistors are respectively coupled to a corresponding one inverter among the inverters, and respectively coupled to a corresponding one among a plurality of local bit lines or a corresponding one among a plurality of local source lines; the first transistors are coupled to a global bit line; and the second transistors are coupled to a global source line.

According to another embodiment, an operation method for a memory device method is provided. The operation method for a memory device comprises: controlling a plurality of local source lines and a plurality of local bit lines by a plurality of first transistors and a plurality of second transistors; wherein the first transistors and the second transistors are triple-well transistors; the first transistors are coupled to a global bit line; and the second transistors are coupled to a global source line.

Figure 1:
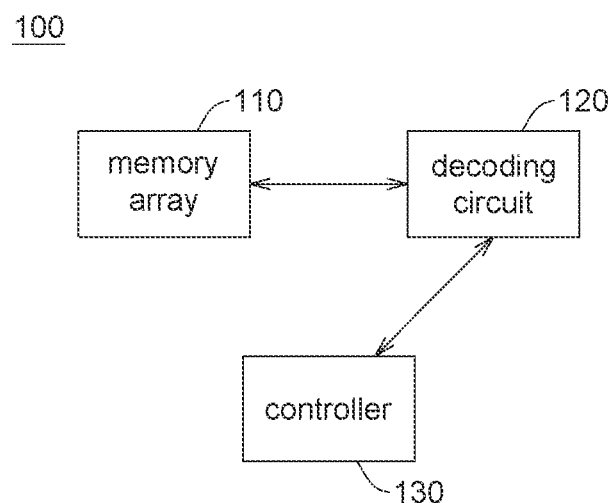
FIG. 1 shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details, In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory device according to one embodiment of the application. The memory device 100 according to one embodiment of the application includes a memory array 110, a decoding circuit 120 and a controller 130. The decoding circuit 120 is coupled to the memory array 110 and the controller 130. The controller 130 controls the memory array 110 and the decoding circuit 120 in read operations, programming operations, byte erase operations, and sector erase operations. Details are as below.

Figure 2:
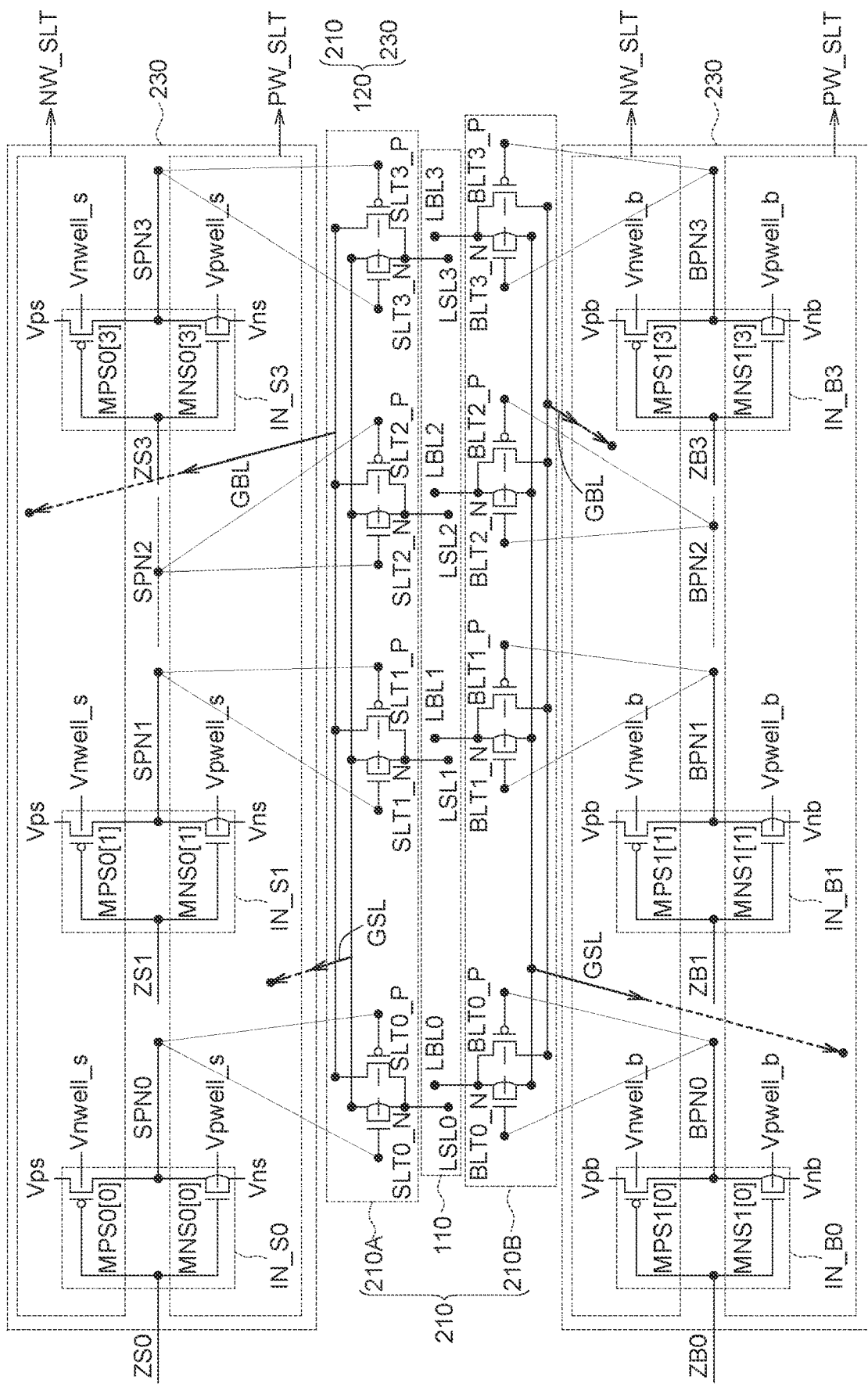
FIG. 2 shows a circuit structure diagram of a memory device according to one embodiment of the application.

FIG. 2 shows a circuit structure diagram of a memory device according to one embodiment of the application. The decoding circuit 120 includes a decoding unit 210 and an inverting unit 230.

The decoding unit 210 includes a plurality of bit line transistors and a plurality of source line transistors. The decoding unit 210 includes a local source line decoder 210A and a local bit line decoder 210B. In FIG. 2, the decoding unit 210 includes eight bit line transistors BLT0_N~BLT3_N and BLT0_P~BLT3_P, and eight source line transistors SLT0_N~SLT3_N and SLT0_P~SLT3_P, which is as an example and not to limit the application. The local source line decoder 210A includes the source line transistors SLT0_N~SLT3_N and SLT0_P~SLT3_P. The local bit line decoder 210B includes the bit line transistors BLT0_N~BLT3_N and BLT0_P~BLT3_P.

In one embodiment of the application, the bit line transistors BLT0_N~BLT3_N and BLT0_P~BLT3_P, and the source line transistors SLT0_N~SLT3_N and SLT0_P~SLT3_P are triple-well transistors.

The inverting unit 230 includes a plurality of inverts. In FIG. 2, the inverting unit 230 includes eight inverters IN_B0~IN_B3 and IN_S0~IN_S3, which is not to limit the application. The inverters IN_B0~IN_B3 and IN_S0~IN_S3 include transistors MNS0[0]~MNS0[3] and MPS0[0]~MPS0[3], MNS1[0]~MNS1[3] and MPS1[0]~MPS1[3].

In FIG. 2, the bit line transistors BLT0_N~BLT3_N and BLT0_P~BLT3_P are coupled to the memory array 110 via the local bit lines LBL0~LBL3, respectively.

In FIG. 2, the source line transistors SLT0_N~SLT3_N and SLT0_P~SLT3_P are coupled to the memory array 110 via the local source lines LSL0~LSL3, respectively.

In other words, in one embodiment of the application, each of the local bit lines LBL0~LBL3 and each of the local source lines LSL0~LSL3 are controlled by a pair of MOS transistors (the bit line transistors BLT0_N~BLT3_N and BLT0_P~BLT3_P, and the source line transistors SLT0_N~SLT3_N and SLT0_P~SLT3_P), respectively.

The bit line transistor BLT0_N includes one terminal coupled to the global source line GSL, another terminal coupled to the local bit line LBL0 and a control terminal coupled to an output of the inverter IN_B0. The bit line transistors BLT1_N~BLT3_N have similar coupling relationships, and details are omitted.

The bit line transistor BLT0_P includes one terminal coupled to the global bit line GBL, another terminal coupled to the local bit line LBL0 and a control terminal coupled to the output of the inverter IN_B0. The bit line transistors BLT1_P~BLT3_P have similar coupling relationships, and details are omitted.

The source line transistor SLT0_N includes one terminal coupled to the global source line GSL, another terminal coupled to the local source line LSL0 and a control terminal coupled to an output of the inverter IN_S0. The source line transistors SLT1_N~SLT3_N have similar coupling relationships, and details are omitted.

The source line transistor SLT0_P includes one terminal coupled to the global bit line GBL, another terminal coupled to the local source line LSL0 and a control terminal coupled to the output of the inverter IN_S0. The source line transistors SLT1_P~SLT3_P have similar coupling relationships, and details are omitted.

In the inverting unit 230, gates of the transistors MNS0[0]~MNS0[3] receive control signals ZS0~ZS3, respectively; sources of the transistors MNS0[0]~MNS0[3] are coupled to the bias voltage Vns; and drains of the transistors MNS0[0]~MNS0[3] are coupled to the outputs SPN0~SPN3.

Similarly, in the inverting unit 230, gates of the transistors MPS0[0]~MPS0[3] receive the control signals ZS0~ZS3, respectively; sources of the transistors MPS0[0]~MNP0[3] are coupled to the bias voltage Vps; and drains of the transistors MPS0[0]~MPS0[3] are coupled to the outputs SPN0~SPN3.

In the inverting unit 230, gates of the transistors MNS1[0]~MNS1[3] receive the control signals ZB0~ZB3, respectively; sources of the transistors MNS1[0]~MNS1[3] are coupled to the bias voltage Vnb; and drains of the transistors MNS1[0]~MNS1[3] are coupled to the outputs BPN0~BPN3.

In the inverting unit 230, gates of the transistors MPS1[0]~MPS1[3] receive the control signals ZB0~ZB3, respectively; sources of the transistors MPS1[0]~MNP1[3] are coupled to the bias voltage Vpb; and drains of the transistors MPS1[0]~MPS1[3] are coupled to the outputs BPN0~BPN3.

The control signals ZB0~ZB3 are decoded information. In the selected tier, the outputs BPN0~BPN3 control gate voltages of the transistors BLT0_N~BLT3_N and BLT0_P~BLT3_P, respectively.

Similarly, the control signals ZS0~ZS3 are also decoded information. In the selected tier, the outputs SPN0~SPN3 control gate voltages of the transistors SLT0_N~SLT3_N and SLT0_P~SLT3_P, respectively.

Bases of the transistors MNS0[0]~MNS0[3] are coupled to the well voltage Vpwell_s. Bases of the transistors MNS1[0]~MNS1[3] are coupled to the well voltage Vpwell_b.

Bases of the transistors MPS0[0]~MPS0[3] are coupled to the well voltage Vnwell_s. Bases of the transistors MPS1[0]~MPS1[3] are coupled to the well voltage Vnwell_b.

In one embodiment of the application, the transistors MNS0[0]~MNS0[3] share the P well PW_SLT; the transistors MPS0[0]~MPS0[3] share the N well NW_SLT; the transistors MNS1[0]~MNS1[3] share the P well PW_BLT; and the transistors MPS1[0]~MPS1[3] share the N well NW_BLT.

In one embodiment of the application, the global source line GSL is optionally coupled to the well voltage Vpwell_b. Or, in one embodiment of the application, the global source line GSL is optionally coupled to the well voltage Vpwell_s.

In one embodiment of the application, the global bit line GBL is optionally coupled to the well voltage Vnwell_b. Or, in one embodiment of the application, the global bit line GBL is optionally coupled to the well voltage Vnwell_s.

The global bit line GBL is coupled to the PMOS transistors SLT0_P~SLT3_P and BLT0_P~BLT3_P. The global source line GSL is coupled to the NMOS transistors SLT0_N~SLT3_N and BLT0_N~BLT3_N.

In one embodiment of the application, in order to prevent forward diode connection, the voltages may be set as the following table 1.

TABLE 1

| Nodes | Voltage setting |
| --- | --- |
| GBL | ≤Vnwell_s, Vnwell_b |
| GSL | ≥Vpwell_s, Vpwell_b |
| Vps | ≤Vnwell_s (or S/B common) |
| Vns | ≥Vpwell_s (or S/B common) |
| Vpb | ≤Vnwell_b (or S/B common) |
| Vnb | ≥Vpwell_b (or S/B common) |

As for the "S/B common" in table 1, S refers to the source terminal, B refers to the body, "S/B common" refers that the source terminal is coupled to the body and thus the source terminal and the body have the same voltage (Vsb=0V) to prevent body effect. In Table 1, in one embodiment of the application, the node voltages are lower than the N well voltages Vnwell_b and Vnwell_s, but higher than the P well voltages Vpwell_b and Vnwell_s. In other words, the P well voltages Vpwell_b and Vnwell_s are set to be lowest among the voltages; and the N well voltages Vnwell_b and Vnwell_s are set to highest among the voltages.

Figure 3:
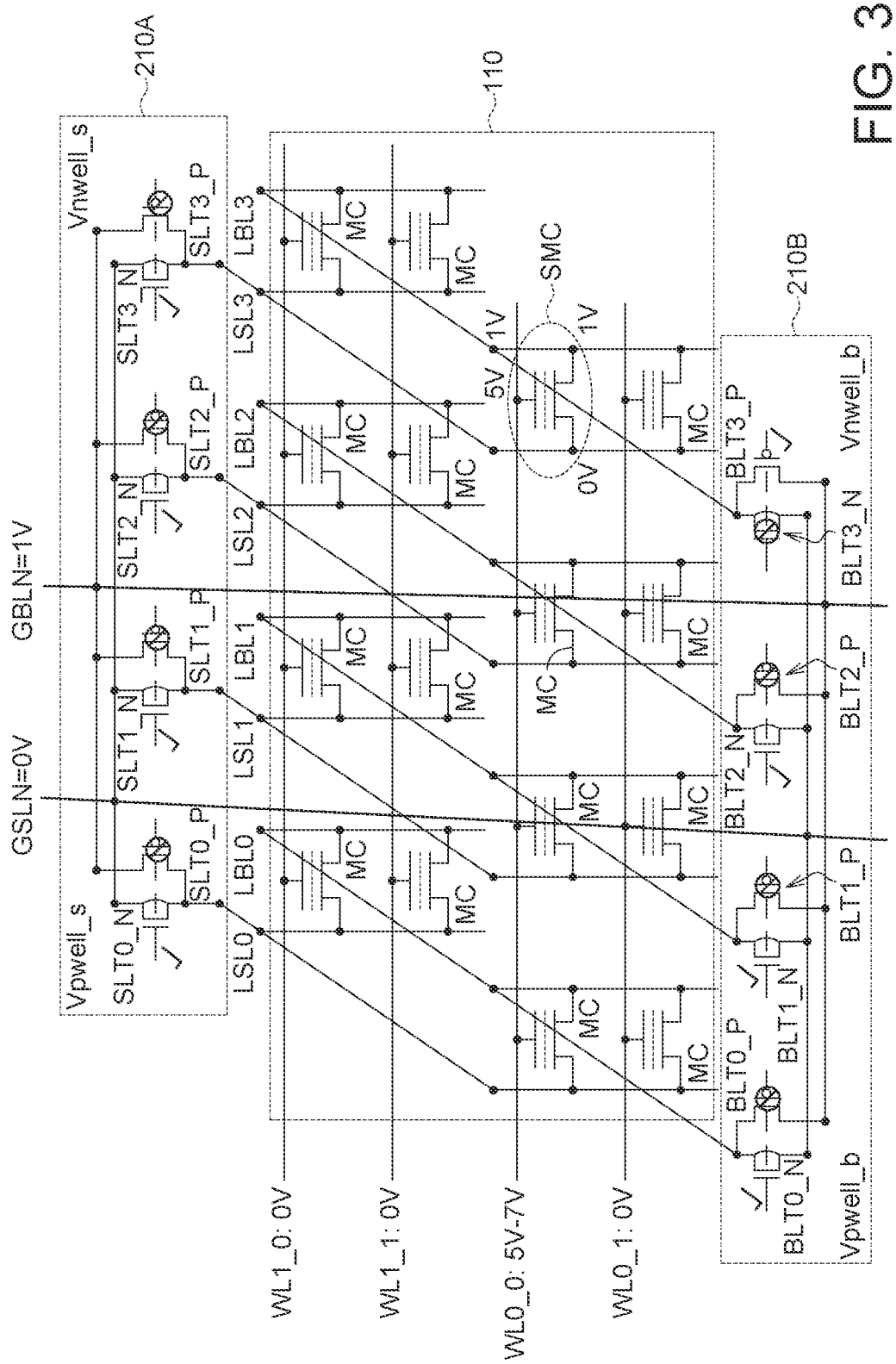
FIG. 3 shows a read operation for a memory device according to one embodiment of the application.

FIG. 3 shows a read operation for a memory device according to one embodiment of the application. In the read operations, the voltages are set as the table 2.

TABLE 2

| | Voltage (V) |
| --- | --- |
| GBLN | 1 |
| GSLN | 0 |
| Selected word line(s) | 5~7 |
| Unselected word line(s) | 0 |
| Vps | 1.8 |
| Vns | 0 |
| Vnwell_s | 1.8 |
| Vpwell_s | 0 |
| Vpb | 1.8 |
| Vnb | 0 |
| Vnwell_b | 1.8 |
| Vpwell_b | 0 |

In FIG. 3, the word line WL0_0 is selected while other word lines (WL0_1, WL1_0, WL1_1) are unselected.

Voltages of the bit line transistors BLT0_N~BLT3_N and BLT0_P~BLT3_P and the source line transistors SLT0_N~SLT3_N and SLT0_P~SLT3_P are as follows.

When gate voltages of the NMOS source line transistors SLT0_N~SLT3_N are set as for example but not limited by, a high level (1.8V), the NMOS source line transistors SLT0_N~SLT3_N are conducted. On the contrary, when gate voltages of the NMOS source line transistors SLT0_N~SLT3_N are set as for example but not limited by, a low level (0V), the NMOS source line transistors SLT0_N~SLT3_N are disconnected.

When gate voltages of the PMOS source line transistors SLT0_P~SLT3_P are set as for example but not limited by, a high level (1.8V), the PMOS source line transistors SLT0_P~SLT3_P are disconnected. On the contrary, when gate voltages of the PMOS source line transistors SLT0_P~SLT3_P are set as for example but not limited by, a low level (0V), the PMOS source line transistors SLT0_P~SLT3_P are conducted.

When gate voltages of the NMOS bit line transistors BLT0_N~BLT3_N are set as for example but not limited by, a high level (1.8V), the NMOS bit line transistors BLT0_N~BLT3_N are conducted. On the contrary, when gate voltages of the NMOS bit line transistors BLT0_N~BLT3_N are set as for example but not limited by, a low level (0V), the NMOS bit line transistors BLT0_N~BLT3_N are disconnected.

When gate voltages of the PMOS bit line transistors BLT0_P~BLT3_P are set as for example but not limited by, a high level (1.8V), the PMOS bit line transistors BLT0_P~BLT3_P are disconnected. On the contrary, when gate voltages of the PMOS bit line transistors BLT0_P~BLT3_P are set as for example but not limited by, a low level (0V), the PMOS bit line transistors BLT0_P~BLT3_P are conducted.

Via the above voltage control, the target memory cell SMC is read, details, in reading, the bit line transistors BLT0_N~BLT2_N are conducted while the bit line transistor BLT3_N is disconnected; the bit line transistors BLT0_P~BLT2_P are disconnected and the bit line transistor BLT3_P is conducted. By this, the conducted bit line transistor BLT 3_P sends the voltage on the global bit line GBLN (=1V) to the target memory cell SMC.

Similarly, in reading, the source line transistors SLT0_N~SLT3_N are conducted while the source line transistors SLT0_P~SLT3_P are disconnected. By this, the conducted source line transistor SLT3_N sends the voltage on the global source line GSLN (=0V) to the target memory cell SMC.

In reading, the local bit line(s) (for example LBL0~LBL2) and the local source linens) (for example LSL0~LSL2) coupled to the unselected memory cells are set as 0V. The local bit line(s) (for example LBL3) coupled to the selected memory cell(s) is/are set as 1V; while the local source line(s) (for example LSL3) coupled to the selected memory cell(s) is/are set as 0V.

Because the gate voltage and the source voltage of the target memory cell SMC are set as 5V~7V and 1V (the voltage of the local bit line LBL3), the gate-source voltage of the target memory cell SMC is VGS=5V~7V. Thus, the target memory cell SMC is conducted and read. Further, because all the local source lines LSL0~LSL3 are forced to 0V by the global source line GSL, the target memory cell SMC coupled to the selected local bit line (LBL3) and the selected word line (WL0_0) is allowed to be read, while other memory cells MC are not conducted.

When a current flows through the target memory cell SMC, the current flows to the sensing amplifier and is converted into a voltage signal. The converted voltage signal is compared with a reference voltage. When the voltage signal is higher than the reference voltage, the target memory cell SMC is determined as a low threshold state. When the voltage signal is lower than the reference voltage, the target memory cell SMC is determined as a high threshold state.

In other words, in one embodiment of the application, in reading, the local source line decoder 210A sends a global source line voltage to a first target memory cell among the memory cells and the local bit line decoder 210B sends a global bit line voltage to the first target memory cell.

Figure 4:
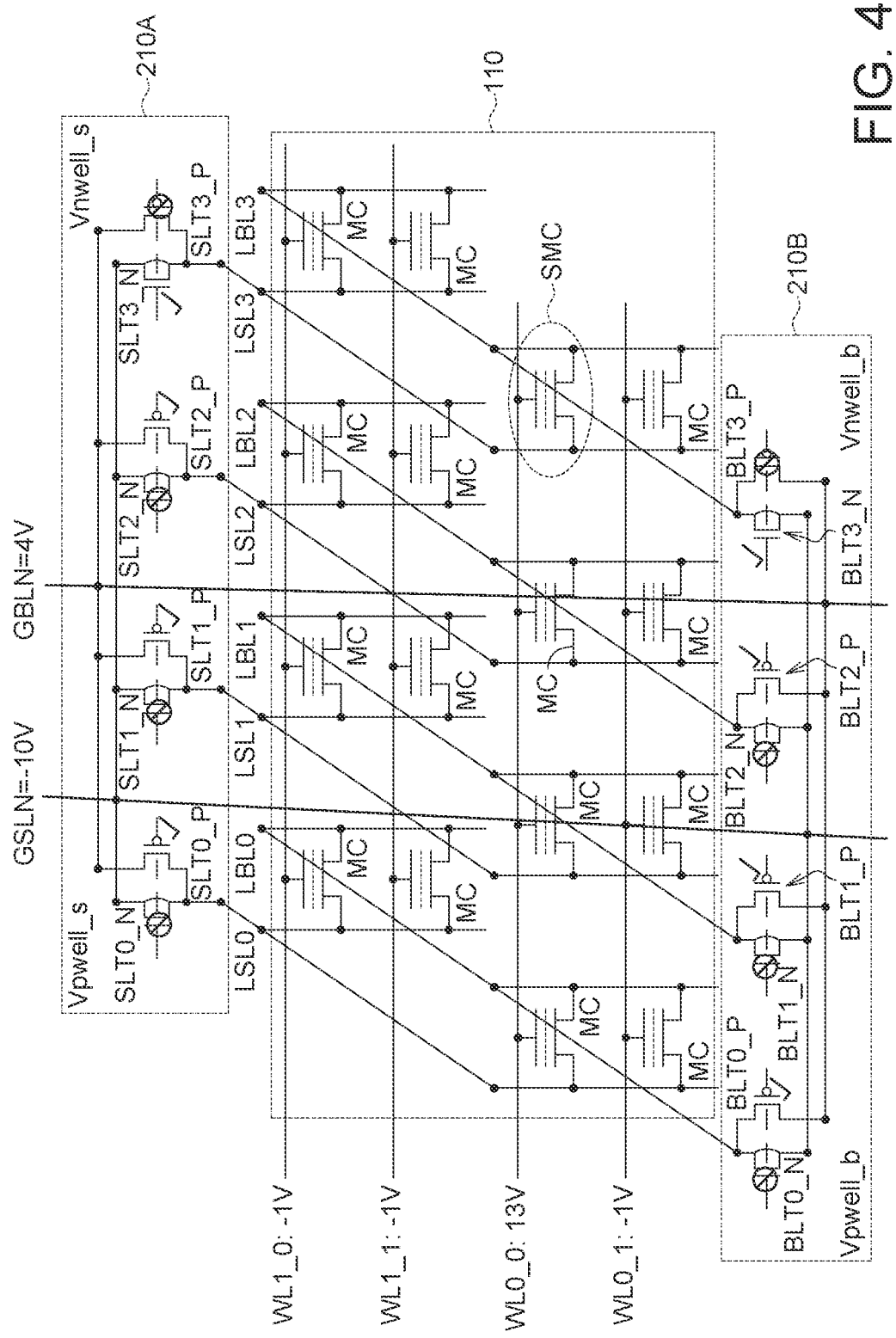
FIG. 4 shows a first programming operation for a memory device according to one embodiment of the application.

FIG. 4 shows a first programming operation for a memory device according to one embodiment of the application. In the first programming operation, the voltages are set as Table 3.

TABLE 3

|  | Voltage (V) |
| --- | --- |
| GBLN | 4 |
| GSLN | −10 |
| Selected word line | 13 |
| Unselected word line | −1 |
| Vps | 4 |
| Vns | −10 |
| Vnwell_s | 4 |
| Vpwell_s | −10 |
| Vpb | 4 |
| Vnb | −10 |
| Vnwell_b | 4 |
| Vpwell_b | −10 |

In FIG. 4, the word line WL0_0 is selected while other word lines (WL0_1, WL1_0, WL1_1) are unselected.

Voltage setting of the bit line transistors BLT0_N~BLT3_N and BLT0_P~BLT3_P and the source line transistors SLT0_N~SLT3_N and SLT0_P~SLT3_P are as follows.

When gate voltages of the NMOS source line transistors SLT0_N~SLT3_N are set as for example but not limited by, a high level (4V), the NMOS source line transistors SLT0_N~SLT3_N are conducted. On the contrary, when gate voltages of the NMOS source line transistors SLT0_N~SLT3_N are set as for example but not limited by, a low level (−10V), the NMOS source line transistors SLT0_N~SLT3_N are disconnected.

When gate voltages of the PMOS source line transistors SLT0_P~SLT3_P are set as for example but not limited by, a high level (4V), the PMOS source line transistors SLT0_P~SLT3_P are disconnected. On the contrary, when gate voltages of the PMOS source line transistors SLT0_P~SLT3_P are set as for example but not limited by, a low level (−10V), the PMOS source line transistors SLT0_P~SLT3_P are conducted.

When gate voltages of the NMOS bit line transistors BLT0_N~BLT3_N are set as for example but not limited by, a high level (4V), the NMOS bit line transistors BLT0_N~BLT3_N are conducted. On the contrary, when gate voltages of the NMOS bit line transistors BLT0_N~BLT3_N are set as for example but not limited by, a low level (−10V), the NMOS bit line transistors BLT0_N~BLT3_N are disconnected.

When gate voltages of the PMOS bit line transistors BLT0_P~BLT3_P are set as for example but not limited by, a high level (4V), the PMOS bit line transistors BLT0_P~BLT3_P are disconnected. On the contrary, when gate voltages of the PMOS bit line transistors BLT0_P-BLT3_P are set as for example but not limited by, a low level (−10V), the PMOS bit line transistors BLT0_P-BLT3_P are conducted.

Via the above voltage control, the first programming operations are performed on the target memory cell SMC. In details, in the first programming operations, the bit line transistors BLT0_N~BLT2_N are disconnected while the bit line transistor BLT3_N is conducted: the bit line transistors BLT0_P~BLT2_P are conducted and the bit line transistor BLT3_P is disconnected. By this, the conducted bit line transistor BLT 3_N sends the voltage on the global source line GBLN (=−10V) to the target memory cell SMC via the local bit line LBL3.

Similarly, in the first programming operations, the source line transistors SLT0_N~SLT2_N are disconnected: the source line transistor SLT3_N is conducted: the source line transistors SLT0_P~SLT2_P are conducted; and the source line transistor SLT3_P is disconnected. By this, the conducted source line transistor SLT3_N sends the voltage on the global source line GSLN (=−10V) to the target memory cell SMC via the local source line LSL3.

In the first programming operations, the local bit line(s) (for example LBL0~LBL2) and the local source line(s) (for example LSL0~LSL2) coupled to the unselected memory cells are set as 4V. The local bit line(s) (for example LBL3) coupled to the selected memory cell(s) is/are set as −10V: while the local source line(s) (for example LSL3) coupled to the selected memory cell(s) is/are set as −10V.

In the following, for explanation, the memory cells are defined as five types: T cell(s), A cell(s), B cell(s), C cell(s) and D cell(s). The T cell(s) is the selected memory cell(s) coupled to the selected word line(s) and the selected LBL(s)/LSL(s). The A cell(s) is the memory cell(s) coupled to the unselected word line(s) and the selected LBL(s)/LSL(s) (wherein the A cell(s) is on the same layer as the T cell(s)). The B cell(s) is the memory cell(s) coupled to the selected word line(s) and the unselected LBL(s)/LSL(s). The C cell(s) is the memory cell(s) coupled to the unselected word line(s) and the selected LBL(s)/LSL(s) (wherein the C cell(s) is on the different layer with the T cell(s)). The D cell(s) is the memory cell(s) coupled to the unselected word line(s) and the unselected LBL(s)/LSL(s). That is, the T cell(s) is selected while the A cell(s), the B cell(s), the C cell(s) and the D cell(s) are unselected.

Figure 5A:
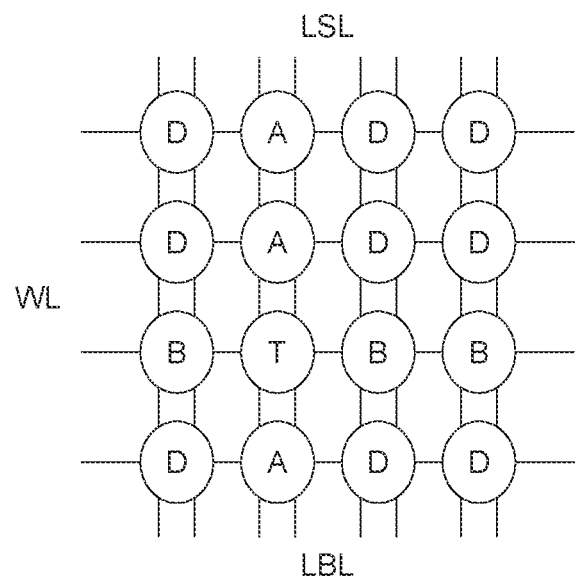
FIG. 5A and FIG. 5B show five cells of a selected layer and a unselected layer.
Figure 5B:
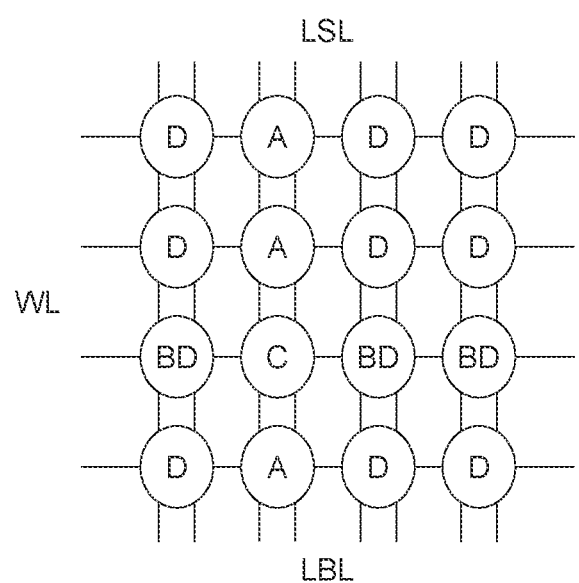

For understanding, refer to FIG. 5A and FIG. 5B. FIG. 5A and FIG. 5B show five cells of a selected layer and a unselected layer.

From the above definition, in one embodiment of the application, in the first programming operations, the selected T cell has VGS as 23V(13V−(−10V)); the unselected A cells have VGS as 9V(−1V−(−10V)); the unselected B cells have VGS as 9V(13V−(4V)); the unselected C cells have VGS as 9V(−1V−(−10V)); and the unselected D cells have VGS as −5V(−1V−(4V)).

In other words, in one embodiment of the application, in the first programming operations, the local source line decoder 210A sends a global source line voltage to a second target memory cell among the memory cells and the local bit line decoder 210B sends the global source line voltage to the second target memory cell.

In one embodiment of the application, each of the local bit lines and each of the local source lines are coupled to the paired PMOS and NMOS transistors (BLT0_N~BLT3_N, BLT0_P~BLT3_P, SLT0_N~SLT3_N and SLT0_P~SLT3_P), the global source line may send the very low voltage (for example but not limited by, −10V) to the selected local bit line and the selected local source line, while the unselected local bit line and the unselected local source line may have higher voltages (for example, 4V which is not higher than the CMOS breakdown voltage (−14V)). Thus, in one embodiment of the application, the PMOS transistors may be used to send high voltages without the body effect. In comparison, in the prior art, the NMOS transistors having the body effect is used to send the high voltage; and thus the prior art has severe body effect.

Still further, in one embodiment of the application, in the first programming operations, each of the local bit lines and each of the local source lines are coupled to a paired PMOS and NMOS transistors (BLT0_N~BLT3_N, BLT0_P~BLT3_P, SLT0_N~SLT3_N, SLT0_P~SLT3_P) respectively, the voltage on the selected local bit line(s) and the selected local source line(s) may concurrently sent via the paired transistors. Thus, in one embodiment of the application, the programming speed is enhanced and no short-time transient stress issue occurs in the startup of the programming pulse(s).

Figure 6:
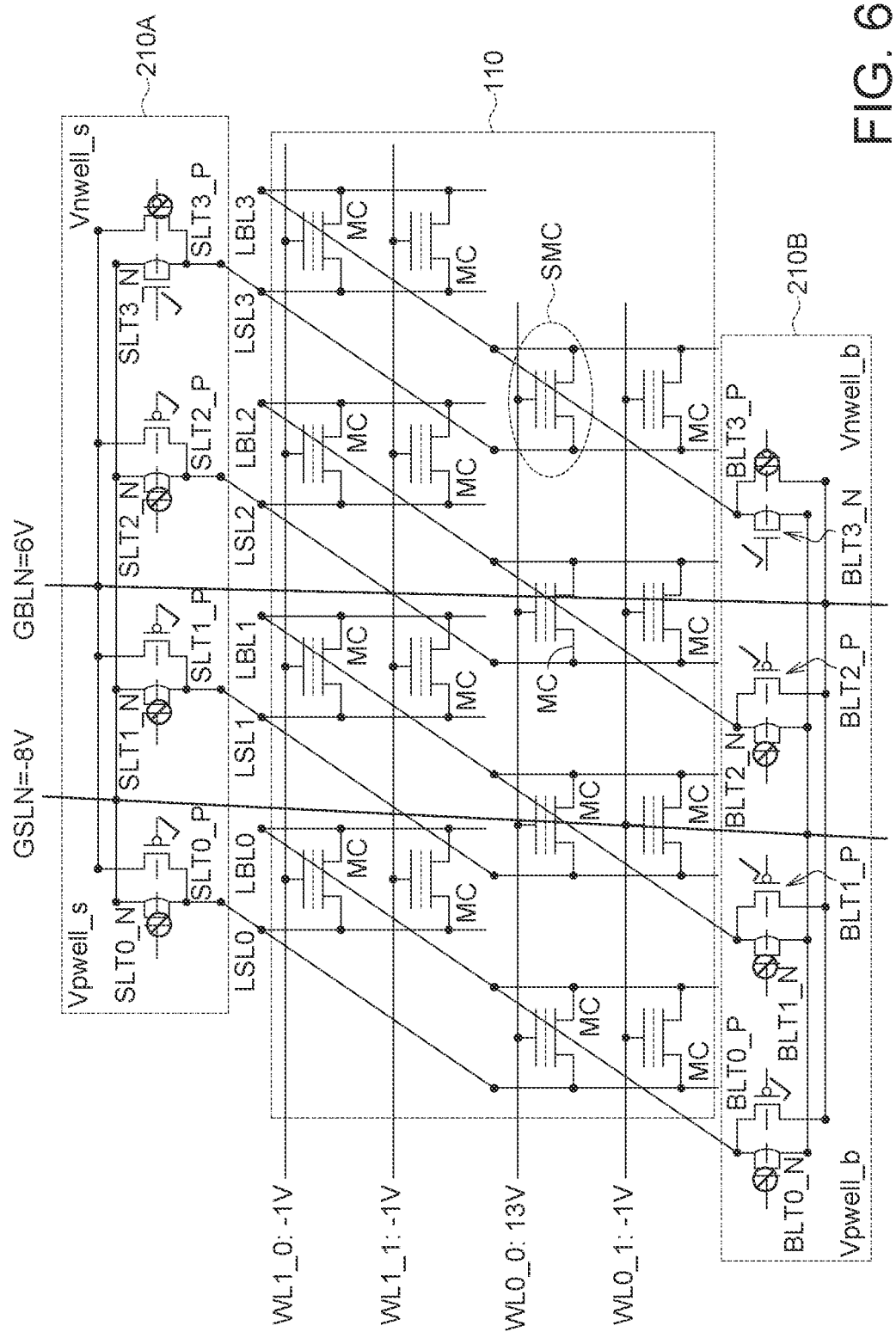
FIG. 6 shows a second programming operation for a memory device according to one embodiment of the application.

FIG. 6 shows a second programming operation for a memory device according to one embodiment of the application. In the second programming operation, the voltages are set as Table 4.

TABLE 4

|  | Voltage (V) |
| --- | --- |
| GBLN | 6 |
| GSLN | −8 |
| Selected word line | 13 |
| Unselected word line | −1 |
| Vps | 6 |
| Vns | −8 |
| Vnwell_s | 6 |
| Vpwell_s | −8 |
| Vpb | 6 |
| Vnb | −8 |
| Vnwell_b | 6 |
| Vpwell_b | −8 |

In FIG. 6, the word line WL0_0 is selected while other word lines (WL0_1, WL1_0, WL1_1) are unselected.

Voltage setting of the bit line transistors BLT0_N~BLT3_N and BLT0_P~BLT3_P and the source line transistors SLT0_N~SLT3_N and SLT0_P~SLT3_P are as follows.

When gate voltages of the NMOS source line transistors SLT0_N~SLT3_N are set as for example but not limited by, a high level (6V), the NMOS source line transistors SLT0_N~SLT3_N are conducted. On the contrary, when gate voltages of the NMOS source line transistors SLT0_N~SLT3_N are set as for example but not limited by, a low level (−8V), the NMOS source line transistors SLT0_N~SLT3_N are disconnected.

When gate voltages of the PMOS source line transistors SLT0_P~SLT3_P are set as for example but not limited by, a high level (6V), the PMOS source line transistors SLT0_P~SLT3_P are disconnected. On the contrary, when gate voltages of the PMOS source line transistors SLT0_P~SLT3_P are set as for example but not limited by, a low level (−8V), the PMOS source line transistors SLT0_P~SLT3_P are conducted.

When gate voltages of the NMOS bit line transistors BLT0_N~BLT3_N are set as for example but not limited by, a high level (6V), the NMOS bit line transistors BLT0_N~BLT3_N are conducted. On the contrary, when gate voltages of the NMOS bit line transistors BLT0_N~BLT3_N are set as for example but not limited by, a low level (−8V), the NMOS bit line transistors BLT0_N~BLT3_N are disconnected.

When gate voltages of the PMOS bit line transistors BLT0_P~BLT3_P are set as for example but not limited by, a high level (6V), the PMOS bit line transistors BLT0_P~BLT3_P are disconnected. On the contrary, when date voltages of the PMOS bit line transistors BLT0_P~BLT3_P are set as for example but not limited by, a low level (-8V), the PMOS bit line transistors BLT0_P~BLT3_P are conducted.

Via the above voltage control, the second programming operations are performed on the target memory cell SMC. In details, in the second programming operations, the bit line transistors BLT0_N~BLT2_N are disconnected while the bit line transistor BLT3_N is conducted; the bit line transistors BLT0_P~BLT2_P are conducted and the bit line transistor BLT3_P is disconnected. By this, the conducted bit line transistor BLT3_N sends the voltage on the global source line GBLN (=-8V) to the target memory cell SMC via the local bit line LBL3

Similarly, in the second programming operations, the source line transistors SLT0_N~SLT2_N are disconnected; the source line transistor SLT3_N is conducted; the source line transistors SLT0_P~SLT2_P are conducted; and the source line transistor SLT3_P is disconnected. By this, the conducted bit line transistor SLT3_N sends the voltage on the global source line GSLN (=-8V) to the target memory cell SMC via the local source line LSL3.

In the second programming operations, the local bit line(s) (for example LBL0~LBL2) and the local source line(s) (for example LSL0~LSL2) coupled to the unselected memory cells are set as 6V. The local bit line(s) (for example LBL3) coupled to the selected memory cell(s) is/are set as -8V; while the local source line(s) (for example LSL3) coupled to the selected memory cell(s) is/are set as -8V.

From the above definition, in one embodiment of the application, in the second programming operations, the selected T cell has VGS as 21V(13V-(-8V)); the unselected A cells have VGS as 7V(-1V-(-8V)); the unselected B cells have VGS as 7V(13V-(6V)): the unselected C cells have VGS as 7V(-1V-(-8V)); and the unselected cells have VGS as -7V(-1V-(6V)).

In other words, in one embodiment of the application, in the second programming operations, the local source line decoder 210A sends a global source line voltage to a third target memory cell among the memory cells and the local bit line decoder 210B sends the global source line voltage to the third target memory cell.

In one embodiment of the application, each of the local bit lines and each of the local source lines are coupled to the paired PMOS and NMOS transistors (BLT0_N~BLT3_N, BLT0_P~BLT3_P, SLT0_N~SLT3_N and SLT0_P~SLT3_P), the global source line may send the very low voltage (for example but not limited by, -8V) to the selected local bit line and the selected local source line, while the unselected local bit line and the unselected local source line may have higher voltages (for example, 6V which is not higher than the CMOS breakdown voltage (-14V)). Thus, in one embodiment of the application, the PMOS transistors may be used to send high voltages without the body effect. In comparison, in the prior art, the NMOS transistors having the body effect is used to send the high voltage; and thus the prior art has severe body effect.

Still further, in one embodiment of the application, in the second programming operations, each of the local bit lines and each of the local source lines are coupled to a paired PMOS and NMOS transistors (BLT0_N~BLT3_N, BLT0_P~BLT3_P, SLT0_N~SLT3_N, SLT0_P~SLT3_P) respectively, the voltage on the selected local bit line(s) and the selected local source line(s) may concurrently sent via the paired transistors. Thus, in one embodiment of the application, the programming speed is enhanced and no short-time transient stress issue occurs in the startup of the programming pulse(s).

Figure 7:
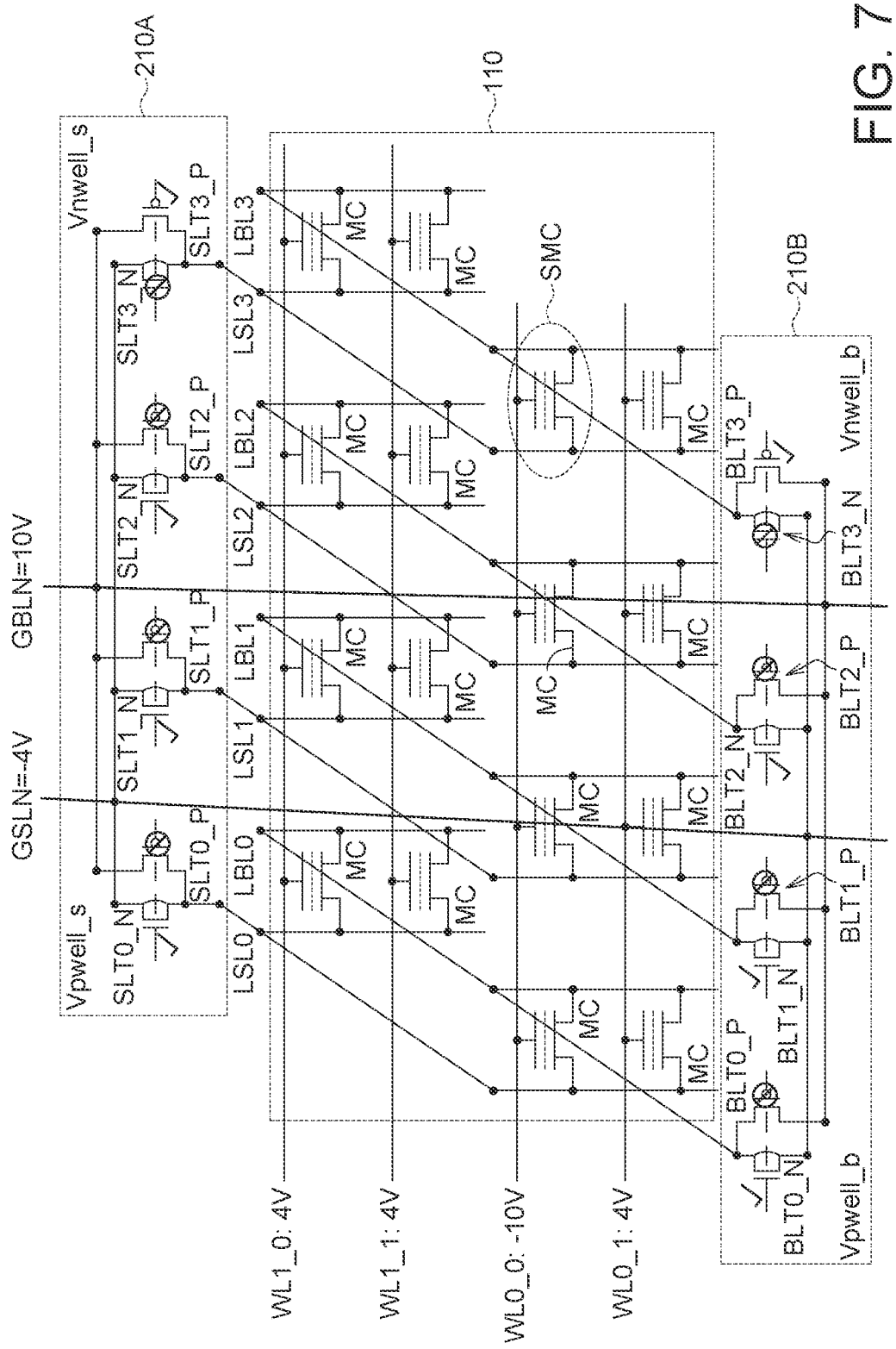
FIG. 7 shows a byte erasing operation for a memory device according to one embodiment of the application.

FIG. 7 shows a byte erasing operation for a memory device according to one embodiment of the application. In the byte erasing operation, the voltages are set as Table 5.

TABLE 5

|  | Voltage (V) |
| --- | --- |
| GBLN | 10 |
| GSLN | -4 |
| Selected word line | -10 |
| Unselected word line | 4 |
| Vps | 10 |
| Vns | -4 |
| Vnwell_s | 10 |
| Vpwell_s | -4 |
| Vpb | 10 |
| Vnb | -4 |
| Vnwell_b | 10 |
| Vpwell_b | -4 |

In FIG. 7, the word line WL0_0 is selected while other word lines (WL0_1, WL1_0, WL1_1) are unselected.

Voltage setting of the bit line transistors BLT0_N~BLT3_N and BLT0_P~BLT3_P and the source line transistors SLT0_N~SLT3_N and SLT0_P~SLT3_P are as follows.

When gate voltages of the NMOS source line transistors SLT0_N~SLT3_N are set as for example but not limited by, a high level (10V), the NMOS source line transistors SLT0_N~SLT3_N are conducted. On the contrary, when gate voltages of the NMOS source line transistors SLT0_N~SLT3_N are set as for example but not limited by, a low level (-4V), the NMOS source line transistors SLT0_N~SLT3_N are disconnected.

When gate voltages of the PMOS source line transistors SLT0_P~SLT3_P are set as for example but not limited by, a high level (10V), the PMOS source line transistors SLT0_P~SLT3_P are disconnected. On the contrary, when gate voltages of the PMOS source line transistors SLT0_P~SLT3_P are set as for example but not limited by, a low level (-4V), the PMOS source line transistors SLT0_P~SLT3_P are conducted.

When gate voltages of the NMOS bit line transistors BLT0_N~BLT3_N are set as for example but not limited by, a high level (10V), the NMOS bit line transistors BLT0_N~BLT3_N are conducted. On the contrary, when gate voltages of the NMOS bit line transistors BLT0_N~BLT3_N are set as for example but not limited by, a low level (-4V) the NMOS bit line transistors BLT0_N~BLT3_N are disconnected.

When gate voltages of the PMOS bit line transistors BLT0_P~BLT3_P are set as for example but not limited by, a high level (10V), the PMOS bit line transistors BLT0_P~BLT3_P are disconnected. On the contrary, when gate voltages of the PMOS bit line transistors BLT0_P~BLT3_P are set as for example but not limited by, a low level (-4V), the PMOS bit line transistors BLT0_P~BLT3_P are conducted.

Via the above voltage control, the byte erase operations are performed on the target memory cell SMC. In details, in the byte erase operations, the bit line transistors BLT0_N~BLT2_N are conducted while the bit line transistor BLT3_N is disconnected: the bit line transistors BLT0_P~BLT2_P are disconnected and the bit line transistor BLT3_P is conducted. By this, the conducted bit line transistor BLT3_P sends the voltage on the global bit line GBLN (=10V) to the target memory cell SMC via the local bit line LBL3.

Similarly, in the byte erase operations, the source line transistors SLT0_N~SLT2_N are conducted: the source line transistor SLT3_N is disconnected; the source line transistors SLT0_P~SLT2_P are disconnected; and the source line transistor SLT3_P is conducted. By this, the conducted source line transistor SLT3_P sends the voltage on the global bit line GBLN (=10V) to the target memory cell SMC via the local source line LSL3.

In the byte erase operations, the local bit line(s) (for example LBL0~LBL2) and the local source line(s) (for example LSL0~LSL2) coupled to the unselected memory cells are set as −4V. The local bit line(s) (for example LBL3) coupled to the selected memory cell(s) is/are set as 10V; while the local source line(s) (for example LSL3) coupled to the selected memory cell(s) is/are set as 10V.

From the above definition, in one embodiment of the application, in the byte erase operations, the selected T cell has VGS as −20V(−10V−(10V)); the unselected A cells have VGS as −6V(4V−(10V)); the unselected B cells have VGS as −6V(−10V−(−4V)); the unselected C cells have VGS as −6V(4V−(10V)); and the unselected D cells have VGS as 8V(4V−(−4V)).

In other words, in one embodiment of the application, in the byte erase operations, the local source line decoder 210A sends a global bit line voltage to a fourth target memory cell among the memory cells and the local bit line decoder 210B sends the global bit line voltage to the fourth target memory cell.

In one embodiment of the application, each of the local bit lines and each of the local source lines are coupled to the paired PMOS and NMOS transistors (BLT0_N~BLT3_N, BLT0_P~BLT3_P, SLT0_N~SLT3_N and SLT0_P~SLT3_P), the global source line may send the very low voltage (for example but not limited by, −4V) to the selected local bit line and the selected local source line, while the unselected local bit line and the unselected local source line may have higher voltages (for example, 10V which is not higher than the CMOS breakdown voltage (−14V)). Thus, in one embodiment of the application, the PMOS transistors may be used to send high voltages without the body effect. In comparison, in the prior art, the NMOS transistors having the body effect is used to send the high voltage; and thus the prior art has severe body effect.

Still further, in one embodiment of the application, in the byte erase operations, each of the local bit lines and each of the local source lines are coupled to a paired PMOS and NMOS transistors (BLT0_N~BLT3_N, BLT0_P~BLT3_P, SLT0_N~SLT3_N, SLT0_P~SLT3_P) respectively, the voltage on the selected local bit line(s) and the selected local source line(s) may concurrently sent via the paired transistors. Thus, in one embodiment of the application, the byte erase speed is enhanced and no short-time transient stress issue occurs in the startup of the programming pulse(s).

Figure 8:
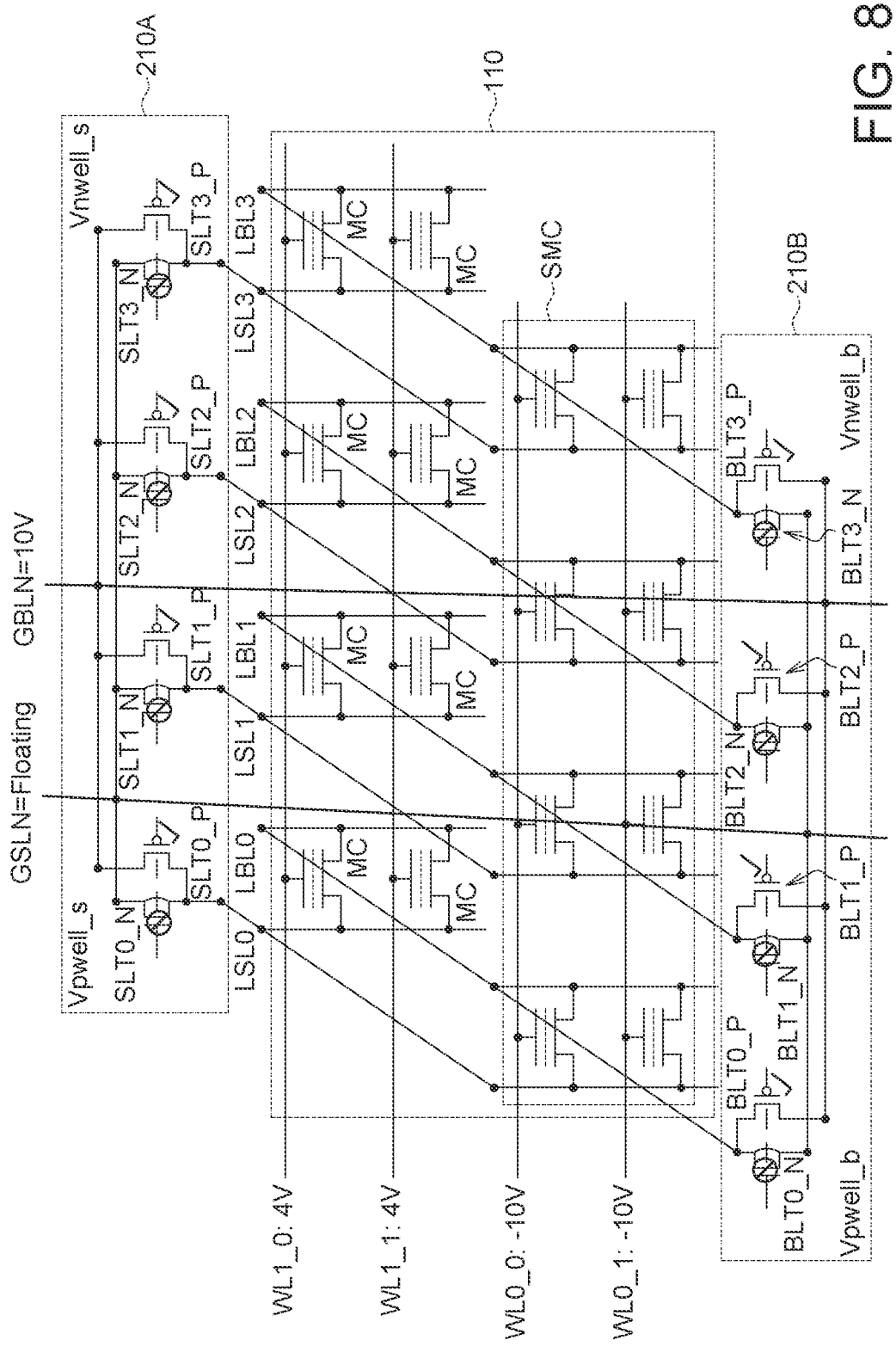
FIG. 8 shows a sector erasing operation for a memory device according to one embodiment of the application.

FIG. 8 shows a sector erasing operation for a memory device according to one embodiment of the application. In the sector erasing operation, the voltages are set as Table 6.

TABLE 6

| | Voltage (V) |
|---|---|
| GBLN | 10 |
| GSLN | floating |
| Selected word line | −10 |

TABLE 6-continued

| | Voltage (V) |
|---|---|
| Unselected word line | 4 |
| Vps | 10 |
| Vns | −4 |
| Vnwell_s | 10 |
| Vpwell_s | −4 |
| Vpb | 10 |
| Vnb | −4 |
| Vnwell_b | 10 |
| Vpwell_b | −4 |

In FIG. 8, the word lines WL0_0 and WL0_1 are selected while other word lines (WL1_0, WL1_1) are unselected.

Voltage setting of the bit line transistors BLT0_N~BLT3_N and BLT0_P~BLT3_P and the source line transistors SLT0_N~SLT3_N and SLT0_P~SLT3_P are as follows.

The gate voltages of the NMOS source line transistors SLT0_N~SLT3_N are set as for example but not limited by, a level (−4V) to disconnect the NMOS source line transistors SLT0_N~SLT3_N; the gate voltages of the PMOS source line transistors SLT0_P~SLT3_P are set as for example but not limited by, a level (−4V) to conduct the PMOS source line transistors SLT0_P~SLT3_P; the gate voltages of the NMOS bit line transistors BLT0_N~BLT3_N are set as for example but not limited by, a level (−4V) to disconnect the NMOS bit line transistors BLT0_N~BLT3_N; and the gate voltages of the PMOS bit line transistors BLT0_P~BLT3_P are set as for example but not limited by, a level (−4V) to conduct the PMOS bit line transistors BLT0_P~BLT3_P.

Via the above voltage control, the sector erase operations are performed on the target memory cell SMC. In details, in the sector erase operations, the bit line transistors BLT0_N~BLT3_N are disconnected; the bit line transistors BLT0_P~BLT3_P are conducted. By this, the conducted bit line transistors BLT0_P~BLT3_P send the voltage on the global bit line GBLN (=10V) to the target memory cell SMC via the local bit lines LBL1~LBL3.

Similarly, in the sector erase operations, the source line transistors SLT0_N~SLT3_N are disconnected; and the source line transistors SLT0_P~SLT3_P are conducted. By this, the conducted source line transistors SLT0_P~SLT3_P send the voltage on the global bit line GBLN (=10V) to the target memory cell SMC via the local source lines LSL1~LSL3.

In the sector erase operations, the local bit line(s) (for example LBL0~LBL3) and the local source line(s) (for example LSL0~LSL3) coupled to the selected memory cells are set as 10V.

From the above definition, in one embodiment of the application, in the sector erase operations, the selected T cell has VGS as −20V(−10V−(10V)); the unselected A cells have VGS as −6V(4V−(10V)); the unselected B cells have VGS as −20V(−10V−(10V)); the unselected C cells have VGS as −20V(−10V−(10V)); and the unselected D cells have VGS as −6V(4V−(10V)).

In other words, in one embodiment of the application, in the sector erase operations, the local source line decoder 210A sends a global bit line voltage to at least one fifth target memory cell among the memory cells and the local bit line decoder 210B sends the global bit line voltage to the at least one fifth target memory cell.

Table 7 shows the gate-source voltage VGS of the five type memory cells in embodiments of the application.

TABLE 7

| Operations | Reading | First programming | Second programming | Byte erase | Sector erase |
|---|---|---|---|---|---|
| T cell | 4 V~6 V | 23 V | 21 V | −20 V | −20 V |
| A cell | −1 V | 9 V | 7 V | −6 V | −6 V |
| B cell | 5 V~7 V | 9 V | 7 V | −6 V | −20 V |
| C cell | −1 V | 9 V | 7 V | −6 V | −20 V |
| D cell | 0 V | −5 V | −7 V | 8 V | −6 V |

From the above table 7, in one embodiment of the application, in the first programming operations, the gate-source voltage VGS of the selected T cell is enlarged (compared with the prior art), and thus the programming speed is enhanced.

Still further, in the second programming operations of one embodiment of the application, the maximum stress disturbance on the B cells is reduced.

As for the byte erase operations, the stress on the B cells is reduced from −8V to −6V and no body effect is induced.

Thus, in one embodiment of the application, compared with the prior art, the programming operations and the erase operations may improve write/erase speed in the three-dimension (3D) AND memory array.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device comprising:
   a memory array;
   a decoding circuit coupled to the memory array, the decoding circuit including a plurality of first transistors, a plurality of second transistors and a plurality of inverters, the first transistors and the second transistors are paired; and
   a controller coupled to the decoding circuit,
   wherein
   the paired first transistors and the paired second transistors are respectively coupled to a corresponding one inverter among the inverters, and respectively coupled to a corresponding one among a plurality of local bit lines or a corresponding one among a plurality of local source lines;
   the first transistors are coupled to a global bit line; and
   the second transistors are coupled to a global source line.

2. The memory device according to claim 1, wherein the first transistors and the second transistors form a local source line decoder and a local bit line decoder;
   the first transistors and the second transistors are coupled to the memory array via the local source lines or the local bit lines; and
   the local source lines or the local bit lines are controlled by the first transistors and the second transistors.

3. The memory device according to claim 2, wherein in a reading operation, the local source line decoder sends a global source line voltage to a first target memory cell among the memory cells and the local bit line decoder sends a global bit line voltage to the first target memory cell.

4. The memory device according to claim 2, wherein in a first programming operation, the local source line decoder sends a global source line voltage to a second target memory cell among the memory cells and the local bit line decoder sends the global source line voltage to the second target memory cell.

5. The memory device according to claim 2, wherein in a second programming operation, the local source line decoder sends a global source line voltage to a third target memory cell among the memory cells and the local bit line decoder sends the global source line voltage to the third target memory cell.

6. The memory device according to claim 2, wherein in a byte erase operation, the local source line decoder sends a global bit line voltage to a fourth target memory cell among the memory cells and the local bit line decoder sends the global bit line voltage to the fourth target memory cell.

7. The memory device according to claim 2, wherein in a sector erase operation, the local source line decoder sends a global bit line voltage to at least one fifth target memory cell among the memory cells and the local bit line decoder sends the global bit line voltage to the at least one fifth target memory cell.

8. An operation method for a memory device, the operation method comprising:
   controlling a plurality of local source lines and a plurality of local bit lines by a plurality of first transistors and a plurality of second transistors;
   wherein
   the first transistors and the second transistors are triple-well transistors;
   the first transistors are coupled to a global bit line;
   the second transistors are coupled to a global source line;
   the first transistors and the second transistors form a local source line decoder and a local bit line decoder; and
   in a first programming operation, the local source line decoder sends a global source line voltage to a second target memory cell among a plurality of memory cells and the local bit line decoder sends the global source line voltage to the second target memory cell.

9. The operation method for the memory device according to claim 8, wherein
   the first transistors and the second transistors are coupled to the memory array via the local source lines or the local bit lines.

10. The operation method for the memory device according to claim 9, wherein
    in a reading operation, the local source line decoder sends a global source line voltage to a first target memory cell among a plurality of memory cells and the local bit line decoder sends a global bit line voltage to the first target memory cell.

11. The operation method for the memory device according to claim 9, wherein in a second programming operation, the local source line decoder sends a global source line voltage to a third target memory cell among a plurality of memory cells and the local bit line decoder sends the global source line voltage to the third target memory cell.

12. The operation method for the memory device according to claim 9, wherein in a byte erase operation, the local source line decoder sends a global bit line voltage to a fourth target memory cell among a plurality of memory cells and the local bit line decoder sends the global bit line voltage to the fourth target memory cell.

13. The operation method for the memory device according to claim 9, wherein in a sector erase operation, the local source line decoder sends a global bit line voltage to at least one fifth target memory cell among a plurality of memory cells and the local bit line decoder sends the global bit line voltage to the at least one fifth target memory cell.

* * * * *